(12) United States Patent
Chin et al.

(10) Patent No.: US 7,381,344 B1
(45) Date of Patent: Jun. 3, 2008

(54) METHOD TO REDUCE PARTICLE LEVEL FOR DRY-ETCH

(75) Inventors: Sheng-Chi Chin, Hsin-Chu (TW); Shy-Jay Lin, Taipei Country (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 09/310,256

(22) Filed: May 12, 1999

(51) Int. Cl.
*B44C 1/22* (2006.01)
(52) U.S. Cl. .............................. 216/67; 216/2; 216/58; 216/66; 438/706; 438/710; 438/714; 438/905; 134/1.1
(58) Field of Classification Search ................... 216/66, 216/67, 2, 58; 438/714, 905, 706, 710; 134/1.1
See application file for complete search history.

(56) References Cited

U.S. PATENT DOCUMENTS

| | | | | |
|---|---|---|---|---|
| 4,786,392 A | | 11/1988 | Kruchowski et al. ....... 204/298 |
| 5,215,619 A | | 6/1993 | Cheng et al. ................ 156/345 |
| 5,221,425 A | * | 6/1993 | Blanchard et al. |
| 5,622,595 A | * | 4/1997 | Gupta et al. ................. 438/710 |
| 5,756,400 A | * | 5/1998 | Ye et al. ..................... 438/710 |
| 6,139,923 A | * | 10/2000 | Gupta ......................... 427/579 |

\* cited by examiner

*Primary Examiner*—Shamim Ahmed
(74) *Attorney, Agent, or Firm*—Thomas, Kayden, Horstemeyer & Risley

(57) ABSTRACT

The invention teaches a multi-step method for shutting down the dry-etch process. The ICP rf power is reduced between each of these consecutive power-down steps of the dry-etch process, the complete power-down sequence consists of six steps. These six steps are executed in sequence and without interruption and form the totality of the dry-etch chamber power-down procedure.

7 Claims, 5 Drawing Sheets

METHOD TO REDUCE PARTICLE LEVEL FOR DRY-ETCH

BACKGROUND OF THE INVENTION (1) Field of the Invention

The invention relates to the field of semiconductor manufacturing, and more specifically to a method to reduce the dry-etch chamber particle level during the power-down procedure of the dry-etch cleaning process for lithography masks.

(2) Description of the Prior Art

The trend within the semiconductor manufacturing industry to micro-miniaturization and the ability to produce chips with sub-micron features has resulted in a continuous increase of the performance of semiconductor chips while at the same time the cost of semiconductor chips has continued to decrease.

Micro-miniaturization of semiconductor chips has been achieved by significant advances in specific semiconductor fabrication disciplines such as photolithography and dry-etching. Sub-micron features in photo-resist layers have been routinely achieved by the use of more sophisticated exposure cameras, as well as by the use of more sensitive photo-resist materials. The successful transfer of the sub-micron images have been made possible by the development of dry-etching tools and procedures, from an overlying photo-resist layer, to an underlying material that is used in the fabrication of semiconductors. Single wafer etching can now be performed with the tools and procedures used during Reactive Ion Etching (RIE). This allows for individual etching of each single wafer, with end point detection used for only this single wafer. In this manner wafer to wafer uniformity variations, of the layer being patterned using single layer RIE etching, is not as great a problem as previously encountered during batch RIE etching. Large volumes of wafers can therefore be confidently processed using single wafer RIE procedures, with a decreased risk of under or over-etching due to thickness variations of the material being etched.

During conventional dry-etch, the dry-etch can be applied to a stack of thin layers which can include a photo-resist (for patterning the underlying layer) or an anti-reflective coating (ARC, used for covering the surface of an underlying layer and typically formed over an aluminum layer prior to coating the aluminum layer with photoresist). Such etching, however, results in residues or deposits building up on surfaces inside the plasma treatment chamber. Similar buildup of deposits occurs in plasma treatment chambers wherein deposition is carried out.

A requirement of dry-etching procedures is the ability to maintain a strong end point detection signal at the completion of the dry-etch cycle when dry-etching from wafer to wafer. In using single wafer RIE tools, the wafer being etched is moved to the etch chamber of the single wafer RIE tool. The etch chamber contains a window for the monitoring of the etching sequence. Laser endpoint detection apparatus or optical diodes monitor, through this window, the chemistry of the reactants and their by-products. At the conclusion of the etching cycle the chemistry of the by-products has changed, the end-point detection process monitors this change. If however the window through which the endpoint monitoring takes place becomes layered with adhering RIE products, the endpoint detection signal will decrease in intensity which can at times result in erroneous end-point signals.

Residual reaction products adhere to surfaces in the plasma treatment chamber when a film is dry-etched in a chlorine-based plasma or fluorine-based dry-etches. These residues can contain metals (or silicates, depending on which type of dry-etch is used), chlorine, or organics or their compounds. The surfaces that the residues adhere to include upper and lower electrode surfaces, walls of the plasma treatment chamber, clamping surfaces, and any other item that the plasma or its byproducts come in contact with. A build-up of these residues deteriorates the etch performance of the dry-etch. As such, the presence of such residues is undesirable.

Using current one-step cleaning procedures results in a violent transition of the plasma in going from the operating condition of rf-on to rf-off. This results in uncontrolled particle levels within the dry-etch chamber, a condition that is very detrimental to the proper operation and control of the dry-etch process. The present invention addresses this operational aspect of the dry-etch process and teaches a method of significantly reducing the particle count of residues or deposits of residual reaction products in the dry-etch chamber at the end of the dry-etch process.

FIGS. 1a through 1e show the current Prior Art one-step cleaning process as applied to a (photolithography) mask.

The FIG. 1a and FIG. 1b conditions indicated below refer to the repetition, that is a first (FIG. 1a) and a second (FIG. 1b) execution of the same process of cleaning the dry-etch chamber under identical operating conditions of the cleaning operation. A one step mode of the dry-etch chamber cleaning process indicates that the operational conditions during the cleaning process remain constant, most specifically the rf power applied during the cleaning process is not varied.

After the dry-clean process has been applied the first time (FIG. 1a) the dry-etch cleaning sequence is stopped and the conditions inside the dry-etch plasma chamber are allowed to stabilize. The dry-clean operating conditions are then reapplied (FIG. 1b) for a given duration, turned off and, after the conditions in the dry-clean chamber have been stabilized, the dry-clean process is considered completed. The processing conditions for the FIG. 1a and FIG. 1b procedures are identical (since FIG. 1b is, as far as operational conditions is concerned, the same as FIG. 1a) and are as follows:

30 mt/600 w ICP/15 w RIE/30 sccm $O_2$/5 min.

These operating conditions indicate that the dry-etch chamber that is being cleaned is of the Inductive Coupled Plasma (ICP) type where an ICP rf power of 600 watts is applied during plasma formation within the chamber, this same power is applied during the dry-etch chamber cleaning procedure while for the cleaning of the dry-etch chamber a RIE etch is applied to the chamber and its contents using 30 sccm of $O_2$ for a time of 5 minutes. The parameter mt stands for milliTorr and is the operating pressure in the dry-etch chamber during processing.

FIG. 1a shows the dry-clean chamber 10, a wall polymer or other residual reaction products 12 and the mask 12 that is positioned on a table 16. A rf coil 18 is provided around and on the outside of the chamber 10, the rf coil 18 generates plasma that attacks the wall polymer 14. The wall polymer 14 evaporates as a consequence of the energy provided by the coil 18 thereby making the cleaning the inside of the dry-etch chamber 10 possible. The wall polymer or other residual reaction products 14 are removed via the suction pump 20. The dry-etch process in the example shown is a dry-etch for a Phase Shift Mask (PSM) with MoSiON etchant and $O_2$ descum. The term descum refers to the process of removing scum whereby scum is an organic or inorganic residue that has collected on the sidewalls of the chamber 10. Using the indicated process, the particle count of the wall polymer or other residual reaction products 12 within the chamber is difficult to control while the particle level is unstable. It is clear that a low particle count is key for the yield of the mask production.

FIG. 1b shows the wall polymer or other residual reaction product molecules 22 being distributed throughout the chamber 10 after the rf coil 18 has been activated at part of the Inductively Coupled Plasma (ICP) process and the RIE etch for the cleaning of the chamber and its contents has been initiated. FIG. 1b represents the power-on, FIG. 1a of the ICP chamber cleaning process.

FIG. 1c shows the condition within the dry-etch chamber between the FIG. 1a and FIG. 1b cycle of the dry-etch process. A number of wall polymer or other residual reaction product modules 24 have settled on the surface of mask 12, a number of other wall polymer or residual reaction product molecules 26 and 28 remain attached to the walls of the dry-etch chamber in a pattern that is not equal on both sides of the chamber but that is determined by complex factors of rf power distribution within the chamber, ionization and polarity of the gas molecules, etc.

FIG. 1d shows the repeat of the dry-etch cleaning process forming FIG. 1b of the dry-etch clean process.

FIG. 1e shows the distribution of the wall polymer or other residual reaction product molecules after FIG. 1b of the dry-etch cleaning process has been completed and after the internal conditions of the chamber have stabilized. It is clear from this that a significant number of the wall polymer or other residual reaction product molecules have been deposited on the surface of the mask 12, which has a negative effect on mask yield.

Noteworthy also is a comparison between entries FIG. 1c and FIG. 1e. This comparison will show that no significant difference has been gained in the distribution of impurity particles within the dry-etch chamber in going from FIG. 1e to FIG. 1c, this despite that fact that the dry-etch process was executed one additional time between these two entries. The repeat execution of the dry-etch process did not result in an improvement of the impurity count within the dry-etch chamber.

U.S. Pat. No. 5,215,619 (Chen et al.) shows a plasma reactor with a cleaning operation.

U.S. Pat. No. 4,786,392 (Kruchowski et al.) shows a fixture for cleaning a plasma etcher.

SUMMARY OF THE INVENTION

It is the primary objective of the invention to provide a method of reducing particle count within the dry-etch chamber at the end of the dry-etch chamber cleaning process.

Another objective of the present invention is to reduce the need for cleaning of the dry-etch chamber.

Yet another objective of the present invention is to prolong the lifetime of Inductively Coupled Plasma (ICP) or any other type of High Density Plasma (HDP) dry-etch processing kits.

In accordance with the objectives of the invention, the invention teaches a multi-step method of reducing applied power during the process of cleaning the dry-etch chamber. The ICP rf power (that is used to agitate the wall polymer or other residual reaction products within the dry-etch chamber) is reduced between each of these consecutive power-down steps of the cleaning of the dry-etch chamber.

BRIEF DESCRIPTION OF THE DRAWINGS

FIGS. 1a and 1b show conventional conditions referring to a first (FIG. 1a) and a second (FIG. 1b) execution of the same process of cleaning the dry-etch chamber under identical operating conditions of the cleaning operation.

FIG. 1c shows the condition within the dry-etch chamber between the FIG. 1a and FIG. 1b cycle of the dry-etch process.

FIG. 1d shows the repeat of the conventional dry-etch cleaning process.

FIG. 1e shows the distribution of the wall polymer or other residual reaction product molecules after FIG. 1b of the dry-etch cleaning process has been completed and after the internal conditions of the chamber have stabilized.

FIG. 2a shows the dry-clean chamber with elements that are contained within and used by the dry-clean chamber. Polymer depositions are also highlighted in FIG. 2a.

FIG. 2b shows the wall polymer or other residual reaction product molecules being distributed throughout the chamber after the rf coil has been activated and the RIE etch has been started. FIG. 2b represents the first step of the power-down sequence of the dry-etch process.

FIG. 2c shows the condition within the dry-etch chamber during execution of dry-etch power-down step 2 within the sequence of six steps of the present invention.

FIG. 2d shows the subsequent steps 4, 5 and 6 of the dry-etch power-down sequence of the present invention.

FIG. 2e shows the final condition within the dry-etch chamber after applying the six step power-down sequence of the present invention.

FIG. 3a shows the Prior Art particle count as a function of time with varying levels of applied rf power.

FIG. 3b shows the particle count obtained under the present invention.

FIG. 4a represents particle measurements taken with a series of measurements performed over a period of several months. These measurements represent the Prior Art method of power-down for the dry-etch process.

FIG. 4b represents particle count measured also over a period of several months, in this case using the power-down procedure of the invention.

DESCRIPTION OF THE PREFERRED EMBODIMENT

Figure 1A:
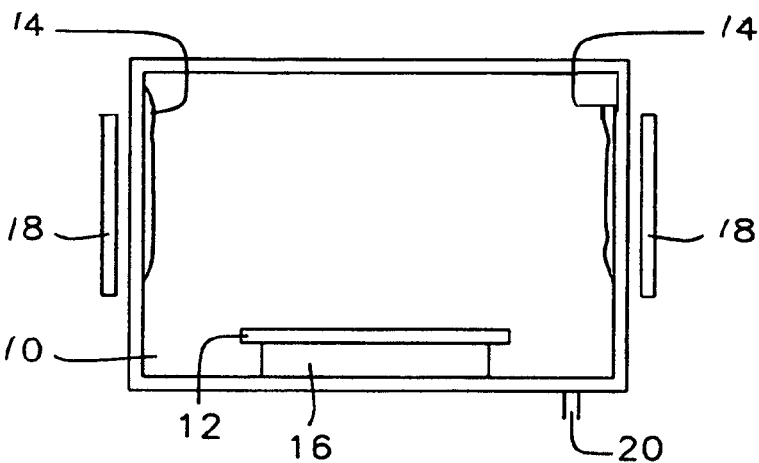
FIGS. 1a through 1e show the sequence of events during the original, Prior Art one-step rf power-down mode, as follows.
Figure 1B:
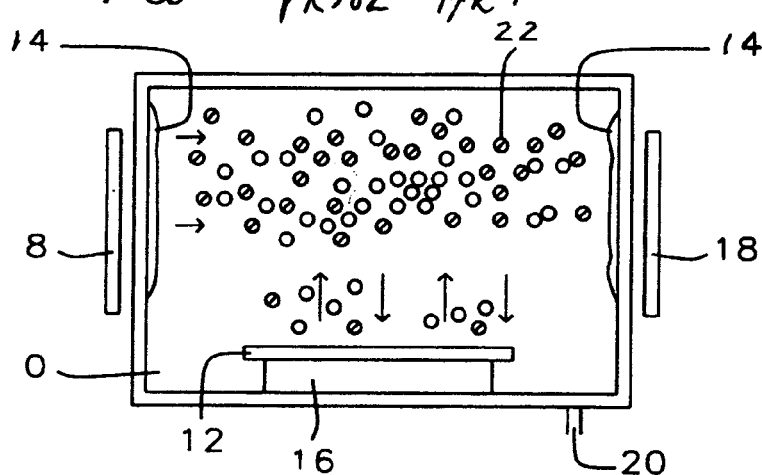
Figure 1C:
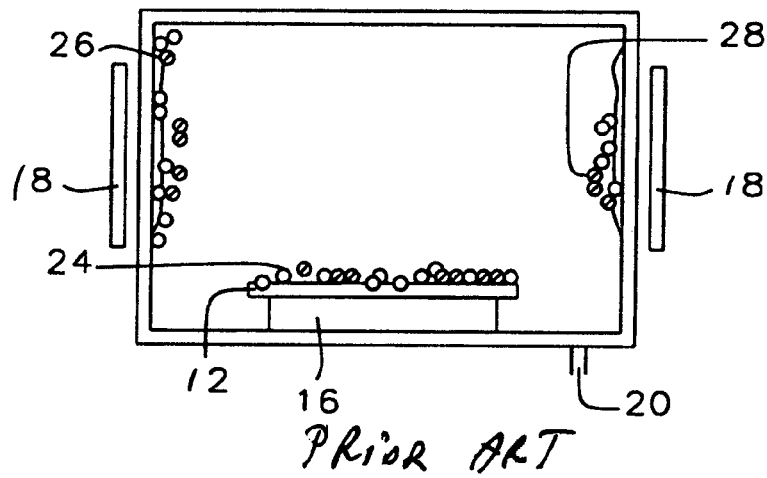
Figure 1D:
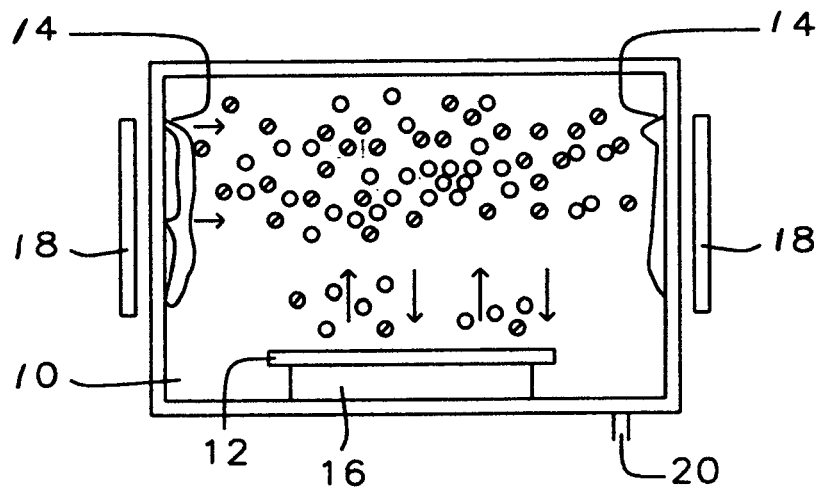
Figure 1E:
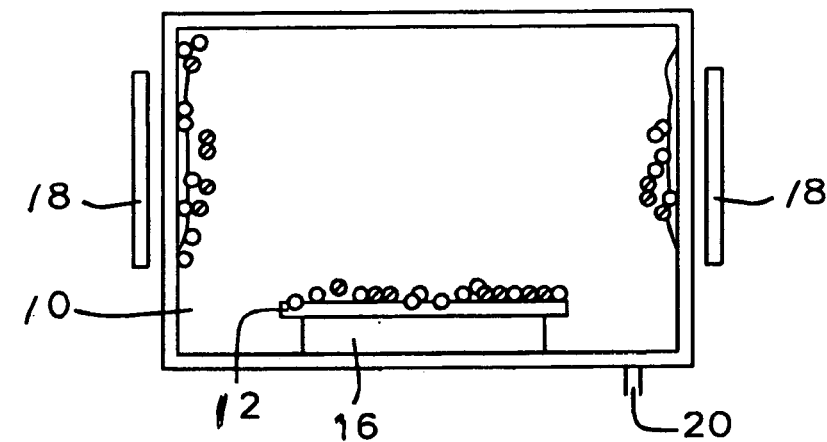

Referring now specifically to FIG. 2, there is shown the cleaning process of the invention as applied to a (photolithography) mask. FIG. 2a shows the dry-clean chamber 40, a wall polymer or other residual reaction product 42 and the mask 44 that is positioned on a table 46. A rf coil 48 is provided around and on the outside of the chamber 40, the rf coil provides the electrical energy to the polymer 42. The polymer, as a consequence of the energy provided by the ICP coil 48, evaporates inside the dry-etch chamber 40. Excess of wall polymer or other residual reaction product is removed via the suction pump 50.

Figure 2A:
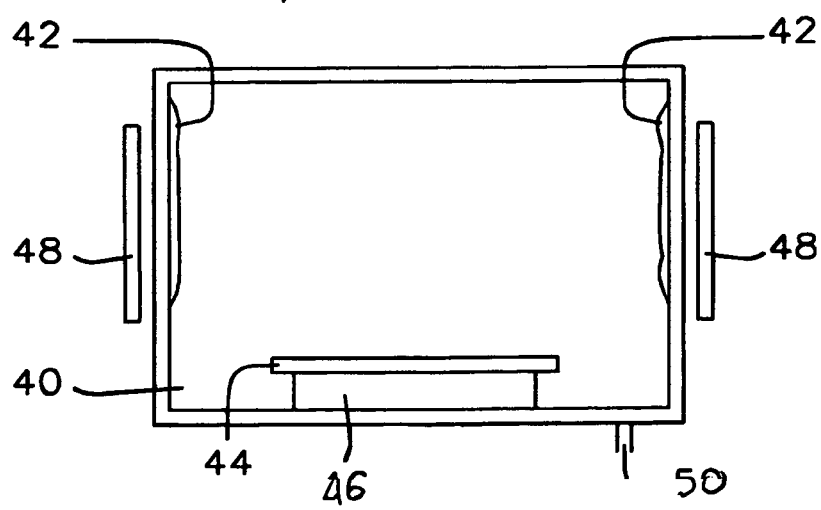
FIGS. 2a through 2e show the sequence of events during the multi-step rf power-down mode of the invention, as follows.
Figure 2B:
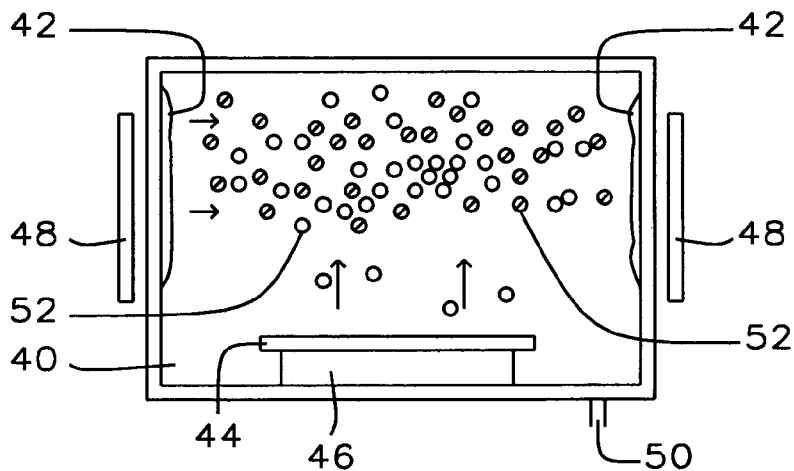

FIG. 2b shows the wall polymer or other residual reaction product molecules 52 being distributed throughout the chamber after the rf coil ICP 48 has been activated and the RIE etch has been started.

FIG. 2b represents the first step of the power-down sequence of the dry-etch process. This first step is out of a total of six dry-etch power-down steps within the scope of the invention. Each of the six steps applies gradually decreasing ICP rf power. The term step in this context is to be interpreted as referring to one step in the complete execution of the power-down procedure of the dry-clean process. The complete execution of the power-down procedure contains six steps, each step taking place under specific and unique processing conditions. In going from a preceding step to a following step the rf power applied is gradually reduced while the duration of the last five steps is shorter than the duration of the first step.

It must be emphasized at this point that, although the example illustrated in FIG. 2 is described as a six step cleaning procedure, the invention is not limited to a reduction of applied ICP rf power in six steps. Key to the invention is that the ICP rf power is, during the process of cleaning the ICP dry-etch chamber, reduced in a controlled and gradual manner. The example discussed under FIG. 2 has selected six discrete steps for this reduction in applied ICP rf power. It is however completely feasible within the scope of the invention to select a different number of steps or to reduce the applied ICP rf power not as a step function but in accordance with some other one-to-one relationship between the applied ICP rf power and the elapsed time during the cleaning process. This functional relationship could for instance be a linear decrease of the applied ICP rf power during the cleaning of the dry-etch chamber or, as another example, partially linear and partially following another relationship between the applied ICP rf power and the elapsed time such as exponential, parabolic, partial sinusoidal, etc.

Figure 2C:
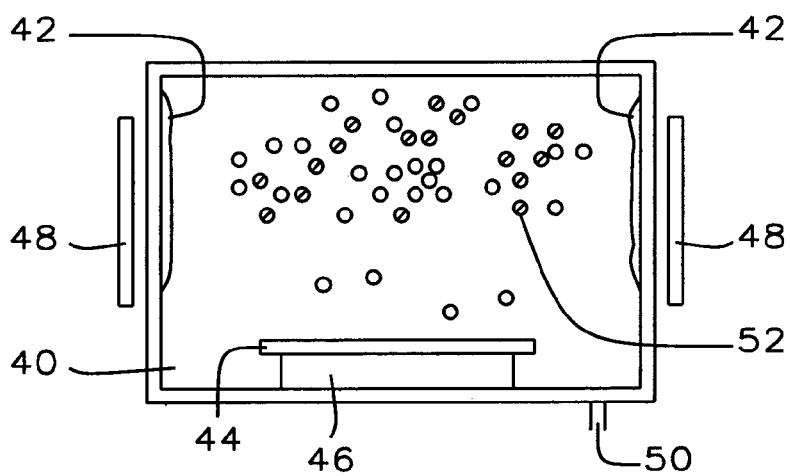

FIG. 2c shows the condition within the dry-etch chamber during execution of dry-etch power-down step 2 within the sequence of six steps of the present invention. No wall polymer or other residual reaction product molecules have settled on the surface of mask 44 and no wall polymer or other residual reaction product molecules have returned to the original source of the wall polymer or other residual reaction product.

Figure 2D:
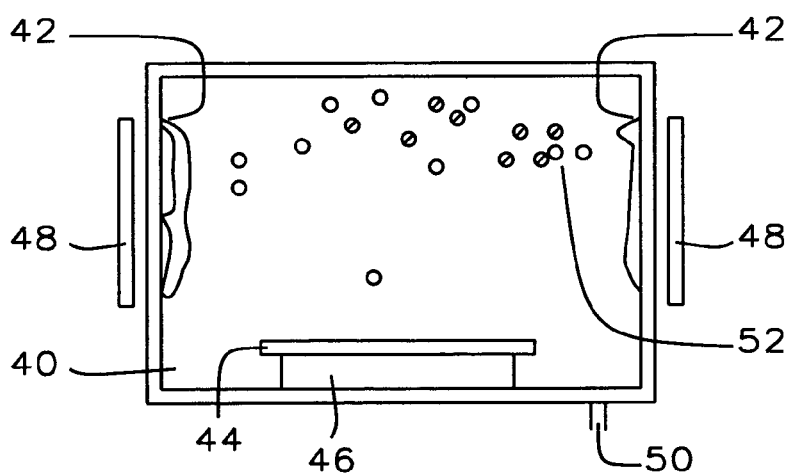

FIG. 2d shows the subsequent steps 4, 5 and 6 of the dry-etch power-down sequence of the present invention. No wall polymer or other residual reaction product molecules have settled on the surface of mask 44 and no wall polymer or other residual reaction product molecules remain attached to the original source of these molecules, excess wall polymer or other residual reaction product molecules have continuously been removed from the chamber by means of the suction pump 50.

Figure 2E:
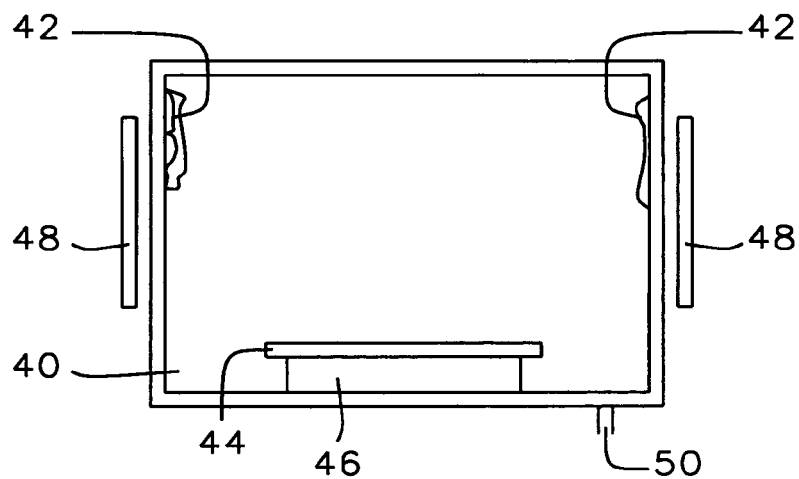

FIG. 2e shows the final condition within the dry-etch chamber after applying the six step power-down sequence of the present invention. Due to the gradual reduction of the ICP rf power combined with the continued removal of wall polymer or other residual reaction product from the chamber, the chamber has been effectively emptied of all depositions. As a consequence no impurity deposition will take place on the surface of mask 44 thereby eliminating the negative effect on yield that such impurities had on Prior Art mask production.

The processing conditions for the six step dry-etch cleaning process of the invention are indicated below. It must be emphasized that the indicated six different steps are executed in the sequence indicated while there is no time lag in going from one step to the following step.

Step 1: 30 mt/600 w ICP/15 w RIE/30 sccm $O_2$/2.5 min
Step 2: 30 mt/560 w ICP/15 w RIE/30 sccm $O_2$/30 sec
Step 3: 30 mt/520 w ICP/15 w RIE/30 sccm $O_2$/30 sec
Step 4: 30 mt/480 w ICP/15 w RIE/30 sccm $O_2$/30 sec
Step 5: 30 mt/440 w ICP/15 w RIE/30 SCCM $O_2$/30 sec
Step 6: 30 mt/400 w ICP/15 w RIE/30 sccm $O_2$/30 sec.

It must be noted that steps 2 through 6 the RIE time required is considerably shorter that the RIE time required for step 1. Particle count could be reduced within the dry-etch chamber by repeating the above indicated step 1 a number of times, the number of times being determined by the required reduction in the particle count. Under the present invention the particle count can be significantly reduced, as shown by measurement results obtained and presented below, whereby this reduction can be obtained without incurring a penalty of time required to achieve this objective.

FIG. 3 shows a graphic depiction of the particle count for both the original Prior Art one step rf power-down mode and the multi-step rf power-down mode of the invention.

Figure 3A:
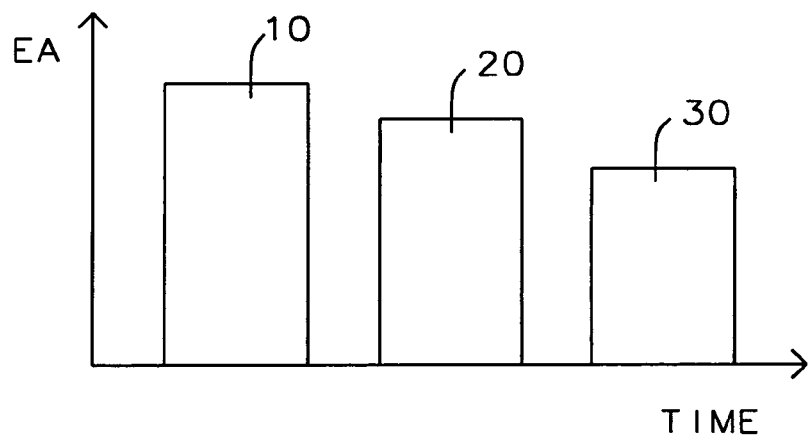
FIGS. 3a and 3b show a graphic depiction of the particle count for both the original Prior Art one step rf power-down mode and the multi-step rf power-down mode of the invention, as follows.

FIG. 3a shows the Prior Art particle count as a function of time. Repetitive executions of the Prior Art power-down procedure will result in gradually reducing the particle count as shown by the gradual decrease of the height of the columns that represent the particle count. This gradual reduction will however require an extended period of time to accomplish the objective of particle reduction. It is also not clear that the particle count can be reduced to zero following this approach.

FIG. 3a, column 10 shows the particle count after the application of the Prior Art cleaning procedure with a rf power level of 600 Watts. In going from column 10 to column 20 to column 30 (and possibly additional columns, not shown), the dry-etch chamber cleaning process is halted and the dry-etch chamber is allowed to establish a stable molecular condition internal to the chamber. FIG. 3a, column 20 shows the particle count after the application of the Prior Art cleaning procedure with a rf power level of 560 Watts. FIG. 3a, column 30 shows the particle count after the application of the Prior Art cleaning procedure with a rf power level of 520 Watts.

Figure 3B:
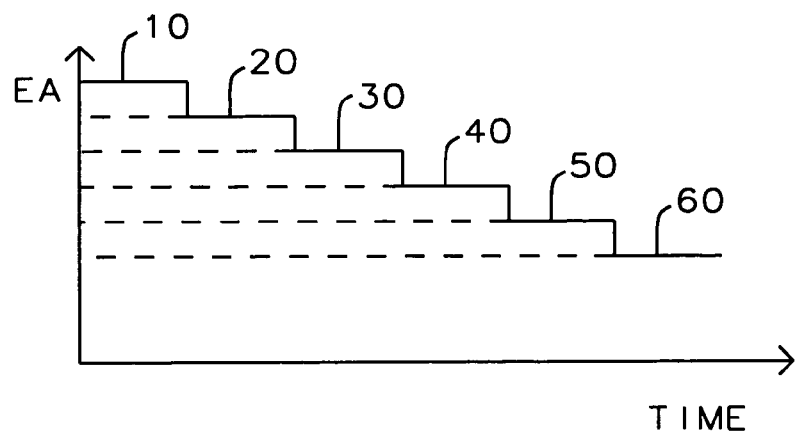

FIG. 3b shows the particle count obtained under the present invention. The graph shows the particle count as a function of time for the various levels of applied ICP rf power. FIG. 3b, level 10 indicates the EA count achieved during the first step of the dry-etch chamber power-down sequence of the invention, level 20 indicates the EA count achieved during the second step of the dry-etch chamber power-down sequence of the invention, the EA level for the remaining steps are indicated by levels 30 through 60 whereby level 60 is the last step of the power-down sequence of the invention. It is clear that the reduction of particles as a consequence of the invention is significant.

It is noteworthy to observe, by comparing FIG. 3a with FIG. 3b, that the events presented in FIG. 3a represent a multiplicity of events whereby, in between each of the events, the dry-etch chamber cleaning operation was halted and the conditions within the dry-etch chamber were allowed to stabilize. The EA count presented in FIG. 3b represents one continuous process whereby the conditions within the dry-etch chamber were not interrupted and were therefore not allowed to reach a stable condition in going from one step to the following step in the cleaning procedure.

FIG. 4 further highlights the reduction in particles achieved by applying the power-down sequence of the invention. The Y-axis represents the particle count, the X-axis represents different times or dates on which the particle counts were measured.

The graph in FIG. 4 represents two different and distinct time sequences within the period during which particle measurements were taken.

Figure 4A:
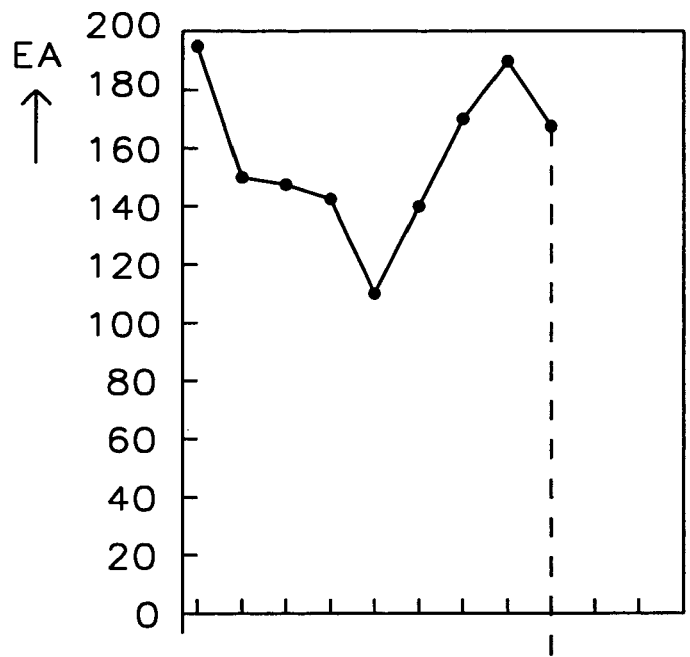
FIGS. 4a and 4b show a graph further illustrating the results obtained using the power-down procedure of the invention, as follows.

The period of time indicated with FIG. 4a represents a series of measurements taken over a period of several months. These measurements represent the Prior Art method of power-down for the dry-etch process, this power-down being one fixed step of processing conditions, specifically relating to the rf power as applied to the ICP coil and the time over which the power-down procedure was performed. The measured particle count over this period is between 170 and 225 EA.

Figure 4B:
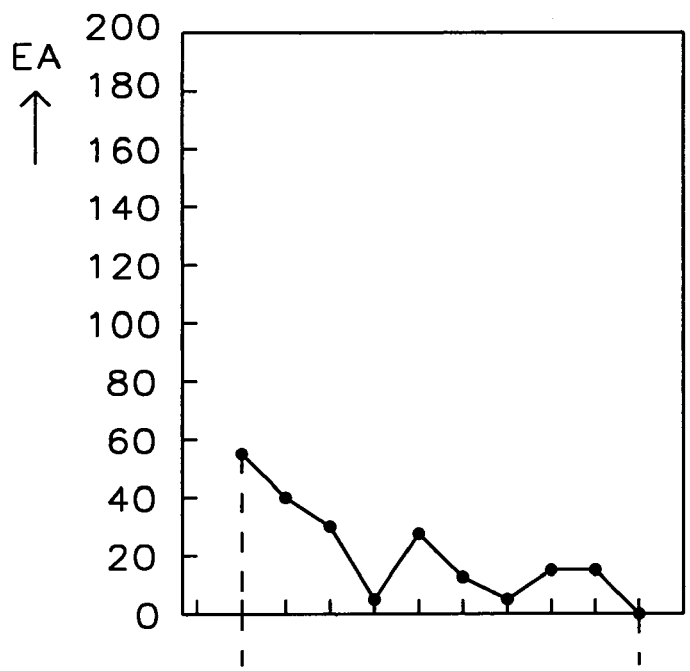

FIG. 4b represents the particle count measured also over a period of several months but in this case using the power-down procedure of the invention. It is clear in comparing the latter test results with the test results obtained using the Prior Art power-down procedure that the power-down procedure of the invention results in significant reduction of the defect count. The measured particle count over the period where the dry-etch power-down procedure of the invention was used is between 24 and 37 EA.

The intuitive and perhaps somewhat simplified explanation for the different results obtained in reducing the particle count within the dry-etch chamber using the two different approaches is as follows.

Using the Prior Art procedure, particles within the dry-etch chamber are, after the rf power is removed, allowed to remain within the chamber and to settle in a position or location that is determined by uncontrolled and uncontrollable conditions of environment within the chamber. These positions are, as far as removing the particles from the chamber is concerned, completely arbitrary and therefore not necessarily conducive to obtaining optimum results of complete removal of the particles from the chamber.

In using the power-down procedure of the invention, the particles within the chamber remain in an agitated state and can therefore not settle down in arbitrary locations or positions. During the power-down procedure of the invention the sucking action of the pump continues to remove particles. By slowly reducing the ICP rf power while not, as under the Prior Art, completely shutting the rf power down, the pumping action can continue to actively and effectively remove the particles and can, in this manner, obtain superior results of removing the particles from the dry-etch chamber.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. Providing a method of reducing particle count at the end of Power-down for an Inductive Coupled Plasma (ICP) dry-etch cleaning chamber, comprising the steps of:
   providing a ICP dry-etch cleaning chamber;
   positioning a workpiece within said cleaning chamber; and
   following a dry-etch chamber power-down procedure, whereby
said power-down is a six step power-down procedure, whereby said six steps of said power-down procedure follow in a given sequence and without interruption or time-lag in between any of said six steps, and whereby step 1 is specified as 30 mt/600 w ICP/15 w RIE/30 sccm $O_2$/2.5 min., whereby further step 2 is specified as 30 mt/560 w ICP/15 w RIE/30 sccm $O_2$/30 sec., whereby further step 3 is specified as 30 mt/520 w ICP/15 w RIE/30 sccm $O_2$/30 sec., whereby further step 4 is specified as 30 mt/480 w ICP/15 w RIE/30 sccm $O_2$/30 sec., whereby further step 5 is specified as 30 mt/440 w ICP/15 w RIE/30 sccm $O_2$/30, whereby further step 6 is specified as 30 mt/400 w ICP/15 w RIE/30 sccm $O_2$/30 sec.

2. The method of claim 1 wherein said six step power down procedure is modified to a sequence of N steps, wherein N is a whole integer number other than zero, where processing conditions for each consecutive step are specified as 30 mt/AA w ICP/15 w RIE/30 sccm $O_2$/30 sec, wherein said AA w ICP represents a value of applied power for the consecutive steps within said sequence, said applied power to decrease concurrent with increases in a value of N, whereby said applied power varies from an initial high value to a final low value.

3. The method of claim 1 wherein said following a dry-etch chamber power-down procedure is a power-down procedure whereby rf power supplied to an Inductive Coupled Plasma (ICP) coil is reduced in a sequential and controlled manner during time of a cleaning process of said dry-etch chamber, whereby at all times during said time there is a one-to-one relationship between rf power supplied to the ICP coil and time of a cleaning cycle.

4. The method of claim 1, said dry-etch chamber having a holding member with a surface which holds wafers or masks to be etched and an enclosing member which encloses the holding member to form a chamber for a plasma, whereby plasma agitation occurs by an rf coil arrangement surrounding said enclosing member, whereby said rf coil arrangement produces a large voltage change near the enclosing member thereby enabling cleaning of the enclosing member by the plasma, whereby furthermore plasma gasses can continuously be removed from said enclosing member by means of a suction pump arrangement attached to said enclosing member.

5. The method of claim 1 wherein said workpiece is a photolithography mask.

6. The method of claim 1 wherein said workpiece is the surface of a semiconductor substrate.

7. The method of claim 1 wherein said workpiece is any surface within the construction of a semiconductor device to which a dry-etch operation must be performed.

* * * * *